(12) United States Patent
Hayashi

(10) Patent No.: US 11,011,682 B2
(45) Date of Patent: May 18, 2021

(54) COMPOSITE BOARD, LIGHT-EMITTING DEVICE, AND MANUFACTURING METHOD OF LIGHT-EMITTING DEVICE

(71) Applicant: NICHIA CORPORATION, Anan (JP)

(72) Inventor: Tadao Hayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/731,290

(22) Filed: Dec. 31, 2019

(65) Prior Publication Data

US 2020/0152839 A1 May 14, 2020

Related U.S. Application Data

(63) Continuation of application No. 15/875,226, filed on Jan. 19, 2018, now Pat. No. 10,566,504, and a continuation of application No. 15/252,747, filed on Aug. 31, 2016, now Pat. No. 9,911,904.

(30) Foreign Application Priority Data

Aug. 31, 2015 (JP) .................................. 2015-171469

(51) Int. Cl.
*H01L 33/48* (2010.01)
*H01L 33/62* (2010.01)
*H01L 25/075* (2006.01)
*H01L 33/54* (2010.01)

(52) U.S. Cl.
CPC ............ *H01L 33/486* (2013.01); *H01L 33/62* (2013.01); *H01L 25/0753* (2013.01); *H01L 33/54* (2013.01); *H01L 2224/48091* (2013.01); *H01L 2224/48227* (2013.01); *H01L 2224/48237* (2013.01); *H01L 2933/005* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| 5,334,874 A | 8/1994 | Metzler et al. | |
| 2001/0051392 A1* | 12/2001 | Akram | H01L 21/56 438/106 |
| 2002/0003293 A1* | 1/2002 | Kobayashi | H01L 21/563 257/676 |
| 2002/0113244 A1* | 8/2002 | Barnett | F21K 9/20 257/98 |
| 2004/0203189 A1 | 10/2004 | Chen et al. | |

(Continued)

FOREIGN PATENT DOCUMENTS

| JP | 2006080312 A | 3/2006 |
| JP | 2006185967 A | 7/2006 |

(Continued)

*Primary Examiner* — Anthony Ho
*Assistant Examiner* — Kevin Quinto
(74) *Attorney, Agent, or Firm* — Hunton Andrews Kurth LLP

(57) ABSTRACT

A composite board is provided with a board and a covering member. The board includes a base made of ceramics, first wiring provided on an upper surface of the base, and second wiring provided on a lower surface of the base and electrically connected to the first wiring. The covering member covers the base such that the first wiring and the second wiring are exposed.

10 Claims, 27 Drawing Sheets

(56) References Cited

U.S. PATENT DOCUMENTS

| | | | |
|---|---|---|---|
| 2008/0191225 A1 | 8/2008 | Medendorp | |
| 2011/0095319 A1* | 4/2011 | Kim | H01L 33/56 |
| | | | 287/98 |
| 2011/0293874 A1 | 12/2011 | Toyooka et al. | |
| 2013/0200516 A1 | 8/2013 | Nakatani et al. | |
| 2013/0264592 A1* | 10/2013 | Bergmann | H01L 33/50 |
| | | | 257/88 |
| 2013/0329425 A1* | 12/2013 | Lowes | F21V 9/00 |
| | | | 362/235 |

FOREIGN PATENT DOCUMENTS

| | | |
|---|---|---|
| JP | 2007266148 A | 10/2007 |
| JP | 2007273592 A | 10/2007 |
| JP | 2008205462 A | 9/2008 |
| JP | 2010118560 A | 5/2010 |
| JP | 2012009850 A | 1/2012 |
| JP | 2013120821 A | 6/2013 |
| JP | 2014082300 A | 5/2014 |
| WO | 2012049822 A1 | 4/2012 |

* cited by examiner

COMPOSITE BOARD, LIGHT-EMITTING DEVICE, AND MANUFACTURING METHOD OF LIGHT-EMITTING DEVICE

CROSS-REFERENCE TO RELATED APPLICATION

This is a Continuation of U.S. application Ser. No. 15/875,226 filed Jan. 19, 2018, which is a Continuation of U.S. application Ser. No. 15/252,747 filed Aug. 31, 2016, which claims priority to Japanese Patent Application No. 2015-171469 filed on Aug. 31, 2015, the entire disclosures of which are incorporated herein by reference.

TECHNICAL FIELD

The present disclosure relates to a composite board, a light-emitting device, and a manufacturing method of a light-emitting device.

BACKGROUND

Ceramic boards in which wiring is formed on a board made of ceramics are known. As a manufacturing method of a light-emitting device using such a ceramic board, a method is known in which, after mounting electronic parts such as a light-emitting element on an assembly of ceramic boards, individual electronic parts are encapsulated by an encapsulant, and the assembly is cut up in a final process to obtain a plurality of light-emitting devices (refer to Japanese Patent Application Laid-open No. 2008-205462).

SUMMARY

A composite board includes a board and a covering member. The board includes a base made of ceramics, first wiring provided on an upper surface of the base, and second wiring which is provided on a lower surface of the base and which is electrically connected to the first wiring. The covering member covers the base such that the first wiring and the second wiring are exposed.

A light-emitting device includes the composite board described above and at least one light-emitting element mounted on the first wiring.

A manufacturing method of a light-emitting device is provided. The method includes: preparing a board assembly which includes a base made of ceramics, and first wiring and second wiring respectively provided on an upper surface and a lower surface of the base; singulating the board assembly by cutting the base to obtain a plurality of boards; placing the plurality of boards on a sheet at predetermined intervals and adhering the plurality of boards to the sheet using an adhesive material; providing a covering member on the sheet to integrate the plurality of boards such that each first wiring is exposed on an upper surface side of each of the plurality of boards; removing the sheet from the plurality of integrated boards to expose each second wiring on a lower surface side of each of the plurality of boards and obtain a composite board assembly; mounting a light-emitting element on each first wiring provided on an upper surface side of the composite board assembly; and singulating the composite board assembly by cutting the covering member to obtain a plurality of light-emitting devices.

According to the configuration described above, a composite board having strength comparable to that of a ceramic board can be manufactured in a shorter period of time and with lower cost than the ceramic board. Therefore, a light-emitting device including the composite board, and a manufacturing method of the light-emitting device can be provided.

DETAILED DESCRIPTION

[Composite Board 1 According to First Embodiment]

Figure 1A:
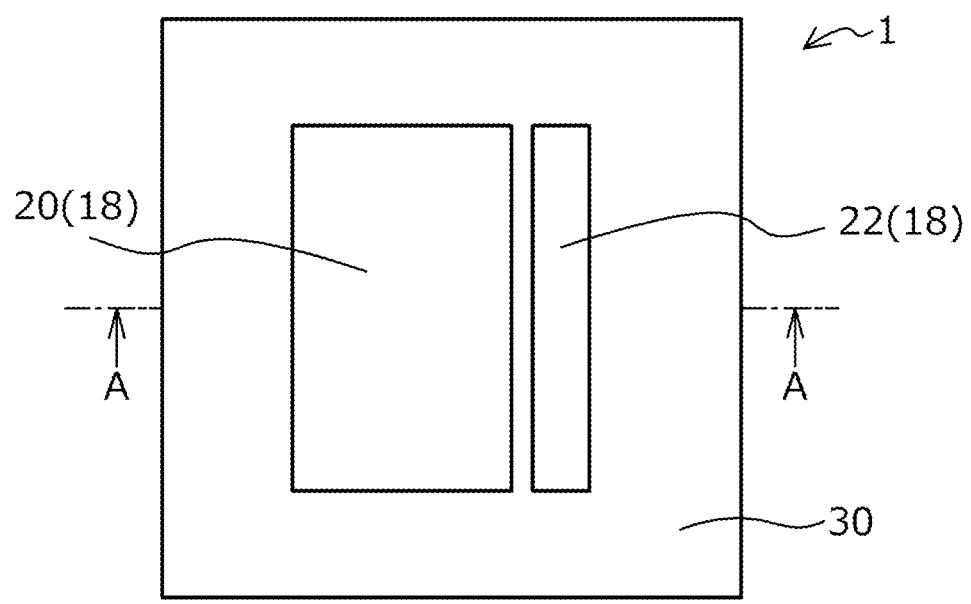
FIG. 1A is a schematic top view of a composite board according to a first embodiment.
Figure 1B:
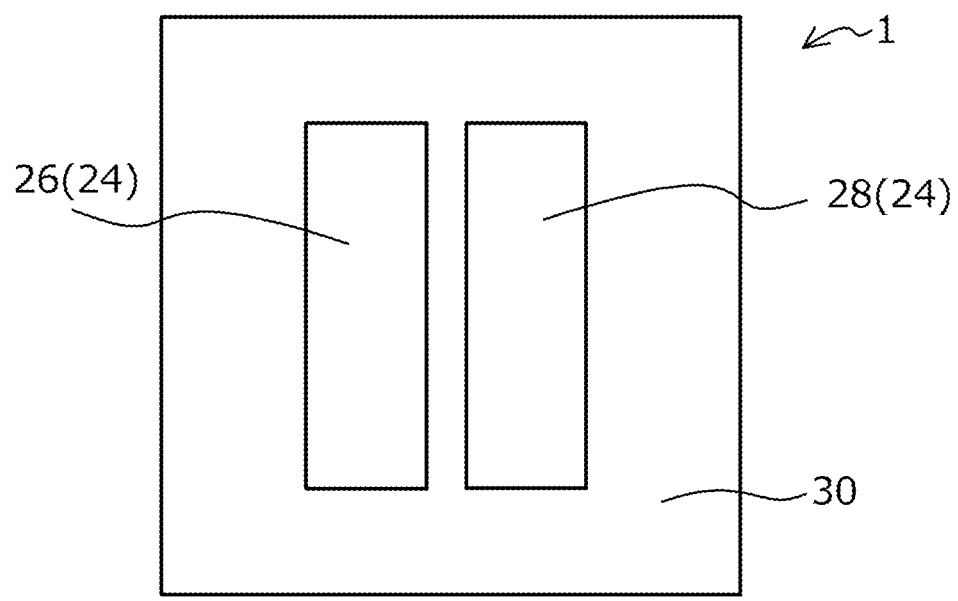
FIG. 1B is a schematic bottom view of a composite board according to the first embodiment.
Figure 1C:
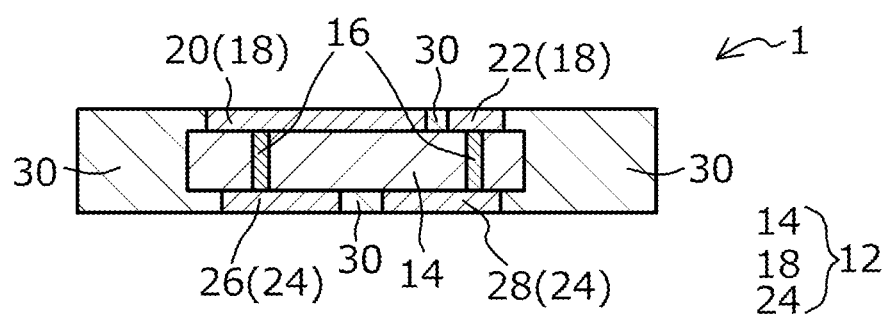
FIG. 1C is a sectional view taken along A-A in FIG. 1A.

According to a first embodiment, FIG. 1A is a schematic top view of a composite board 1, FIG. 1B is a schematic bottom view of the composite board 1, and FIG. 1C is a sectional view taken along A-A in FIG. 1A. As shown in FIGS. 1A to 1C, the composite board 1 includes a board 12 and a covering member 30. The board 12 includes a base 14 made of ceramics, first wiring 18 provided on an upper surface of the base 14, and second wiring 24 which is provided on a lower surface of the base 14 and which is electrically connected to the first wiring 18.

The covering member 30 covers the base 14 such that the first wiring 18 and the second wiring 24 are exposed. An orderly description will be given below.

(Board 12: Base 14 made of Ceramics)

The base 14 is a member that serves as a base of the board 12. The base 14 is made of ceramics and has an insulating property. Specifically, examples of the base 14 include members made of alumina, aluminum nitride, zirconia, silicon nitride, silicon carbide, aluminosilicate, low temperature co-fired ceramics (LTCC), and a combination of these materials. The base 14 may be constituted by a single layer or by a plurality of layers.

When the base 14 is constituted by a plurality of layers, internal wiring may be provided between the layers.

(Board 12: First Wiring 18, Second Wiring 24)

The first wiring 18 is provided on the upper surface (i.e., an uppermost surface) of the base 14 and the second wiring 24 which is electrically connected to the first wiring 18 is provided on the lower surface (i.e., a lowermost surface) of the base 14. A light-emitting element 34 (to be described later) is mounted on the first wiring 18, and the second wiring 24 is connected to an external electrode or the like. The first wiring 18 includes a first region 20 and a second region 22 which are separated from each other and function as a pair of positive and negative electrodes. In a similar manner, the second wiring 24 includes a first region 26 and a second region 28 which are separated from each other and function as a pair of positive and negative electrodes. The first region 20 of the first wiring 18 and the first region 26 of the second wiring 24 are electrically connected to each other via, for example, a through-hole (i.e., via) 16. In a similar manner, the second region 22 of the first wiring 18 and the second region 28 of the second wiring 24 are electrically connected to each other via, for example, another through-hole (i.e., via) 16. These regions can be electrically connected to each other by methods other than the through-holes 16, for example, by providing a metal that joins the first region 20 and the first region 26 and a metal that joints the second region 22 and the second region 28 on a lateral surface of the base 14.

The first wiring 18 and the second wiring 24 can be formed using various metal materials. For example, the first wiring 18 and the second wiring 24 can be formed by providing W, Cu, or the like on the base 14 and then firing the base 14, and subsequently plating a surface of W, Cu, or the like with one or more types of metals such as Au, Ag, Pt, Pd, Rh, Ni, Cu, W, Mo, Cr, Ti, Al, or alloys thereof. The plating formed on the surface of W or Cu may be formed as a single layer or as a plurality of layers.

Figure 1D:
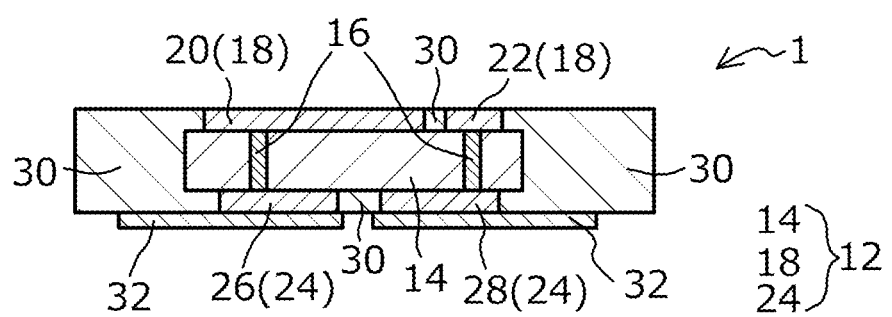
FIG. 1D is a schematic view showing an example of an extending portion.

For example, as shown in FIG. 1D, a conductive member (hereinafter, referred to as an extending portion 32) which is electrically connected to the second wiring 24 may be provided on a lower surface of the composite board 1. The extending portion 32 functions as a part of the wiring of the composite board 1. By extending the extending portion 32 from lower surfaces of the second wiring 24 to a lower surface of the covering member 30 (e.g., extending in a horizontal direction in FIG. 1D), an area of the wiring provided on the lower surface of the composite board 1 can be made larger than an area of the lower surfaces of the second wiring 24. Accordingly, since a contact area of the wiring provided on the lower surface of the composite board 1 with respect to an external electrode can be increased, solder mountability can be improved. In addition, heat dissipation of the composite board 1 can also be improved. The extending portion 32 can be provided by, for example, performing plating, sputtering, or the like on the second wiring 24.

(Covering Member 30: Material of Covering Member 30)

The covering member 30 employs a resin having a property of lower strength than that of the base 14 and having a lower likelihood of occurrences of cracking and chipping during cutting (i.e., during singulation) than the base 14. Examples of resins having such property include one or more resins selected from a group consisting of triazine derivative epoxy resin, epoxy resin, modified epoxy resin, silicone resin, modified silicone resin, acrylate resin, urethane resin, and unsaturated polyester.

The covering member 30 may include an acid anhydride, an antioxidant, a mold-releasing material, a light reflective member, an inorganic filler, a curing catalyst, a light stabilizer, and/or a lubricant as one or more additives in the resin. Although a total amount of such additives contained in the covering member 30 is preferably within 20 to 90 wt % with respect to the resin, the total additive amount is not particularly limited.

To improve the reflectance of the composite board 1, the resin of the covering member 30 may contain 40 to 70 wt % of titanium oxide ($TiO_2$) as an additive. In addition, the strength of the composite board 1 can be improved by adding 20 to 70 wt % of glass fiber as an inorganic filler in the resin. Examples of a light reflective member to be used as an additive include titanium oxide, silicon dioxide, zirconium dioxide, potassium titanate, alumina, aluminum nitride, zinc oxide, boron nitride, and mullite.

(Covering Member 30: Covering by Covering Member 30)

The covering member 30 covers the base 14 such that the first wiring 18 and the second wiring 24 are respectively exposed. In other words, the covering member 30 covers the base 14 such that the first wiring 18 and the second wiring 24 are not completely covered. The covering member 30 needs to cover at least one lateral surface of the base 14. For example, when the base 14 has four lateral surfaces, one lateral surface may be covered by the covering member 30 and the remaining three lateral surfaces may be left exposed. In this case, by providing recesses at lower portions of the three exposed lateral surfaces, the recesses become a castellation of the composite board 1. In this case, by arranging a conductive member electrically connected to the first wiring 18 and the like on an inner wall of the castellation or the like, a solder fillet can be readily formed when mounting a light-emitting device provided with the composite board 1 on a secondary board using a solder and, accordingly, the light-emitting device can be reliably mounted on the secondary board.

The covering member 30 preferably covers an entirety or a part of the upper surface of the base 14, an entirety or a part of the lower surface of the base 14, or the entirety or a part of the upper surface and the entirety or a part of the lower surface of the base 14. Accordingly, since adhesion between the covering member 30 and the base 14 increases, the strength of the composite board 1 is improved. In addition, due to increase of reflectance of the composite board 1, light output of a light-emitting device provided with the composite board 1 is improved.

The covering member 30 can be provided such that, for example, surfaces of the first wiring 18 and a surface of the covering member 30 are flush with each other (including an approximately flush with each other) on the upper surface of the composite board 1. In other words, the covering member 30 can be provided to fill gaps between the first wirings 18 on the upper surface of the base 14.

However, the covering member 30 can be provided such that the surfaces of the first wiring 18 are higher than the surface of the covering member 30. In this case, since the covering member 30 does not interfere with the light-emitting element 34 (to be described later) when mounting the light-emitting element 34 on the first wiring 18, the light-emitting element 34 can be adhered and joined to the first wiring 18 in a stable manner. In addition, in this case, since a height of the light-emitting element 34 is greater than the upper surface of the covering member 30 as compared to a case where the surfaces of the first wiring 18 are flush with the surface of the covering member 30, a light-emitting device with a wide light distribution which is suitable for an application as a surface light source and the like can be provided.

Furthermore, the covering member 30 can also be provided such that the surfaces of the first wiring 18 are lower than the upper surface of the covering member 30. In this case, a lateral surface of the light-emitting element 34 can be supported by the covering member 30 such that the light-emitting element 34 is tilted. In this case, since the height of the light-emitting element 34 is lower than the upper surface of the covering member 30 as compared to a case where the surfaces of the first wiring 18 are flush with the upper surface of the covering member 30, a light-emitting device with a narrow light distribution which is suitable for an application as a point light source used in combination with a lens or a reflector can be provided.

The covering member 30 can be provided such that, for example, the surfaces of the second wiring 24 and the upper surface of the covering member 30 are flush with each other (including an approximately flush with each other) on the lower surface of the composite board 1. In other words, the covering member 30 can be provided to fill gaps between the second wirings 24 on the lower surface of the base 14. Accordingly, since solder is less likely to wet and spread to a lateral surface of the second wiring 24 when joining the second wiring 24 and an external electrode to each other with the solder, a short-circuit between the first region 26 and the second region 28 of the second wiring 24 due to excessive spreading of the solder can be prevented.

However, covering member 30 can also be provided such that the surfaces of the second wiring 24 are higher than the upper surface of the covering member 30. In this case, a solder fillet can be formed on a lateral surface of the second wiring 24 to increase adhesive strength of the soldering.

Furthermore, the covering member 30 can also be provided such that the surfaces of the second wiring 24 are lower than the upper surface of the covering member 30. In this case, tilting of the light-emitting element 34 can be less likely to occur when joining the second wiring 24 and an external electrode to each other with a solder.

(Covering Member 30: Thickness of Covering Member 30)

A thickness of the covering member 30 on a lateral surface of the base 14 is, for example, around 100 μm to 1000 μm. The covering member 30 on the lateral surface of the base 14 may be thicker than the base 14, thinner than the base 14, or have a same thickness (including an approximately same thickness) as the base 14. However, when the composite board 1 is fabricated in a flat plate shape, the covering member 30 on the lateral surface of the base 14 preferably has a same thickness (including an approximately same thickness) as the base 14.

According to the first embodiment described above, as will be described later, since a composite board assembly can be singulated by cutting the covering member 30, the composite board 1, which has a strength comparable to that of a ceramic board but which can be manufactured in a shorter period of time and with lower cost than the ceramic board, can be provided. In addition, according to the first embodiment, the covering member 30 acts as a buffer, which leads to reduction in warpage of the base 14. As a result, the various components, such as the light-emitting element 34, an encapsulant 36, and the like (to be described later), mounted on the composite board 1 is less likely to be damaged, specifically for example racked, due to such warpage.

Furthermore, according to the first embodiment, by expanding a width or depth of the covering member 30 at a side of the base 14 instead of expanding a width or depth of the base 14, an upper surface area of the entire composite board 1 can be increased and even a large encapsulant 36 can be arranged on the composite board 1. Therefore, even a light-emitting device including a large encapsulant 36 can be provided at low cost. This is because, generally, the covering member 30 is less expensive than the base 14.

[Light-Emitting Device 100 According to First Embodiment]

Figure 2A:
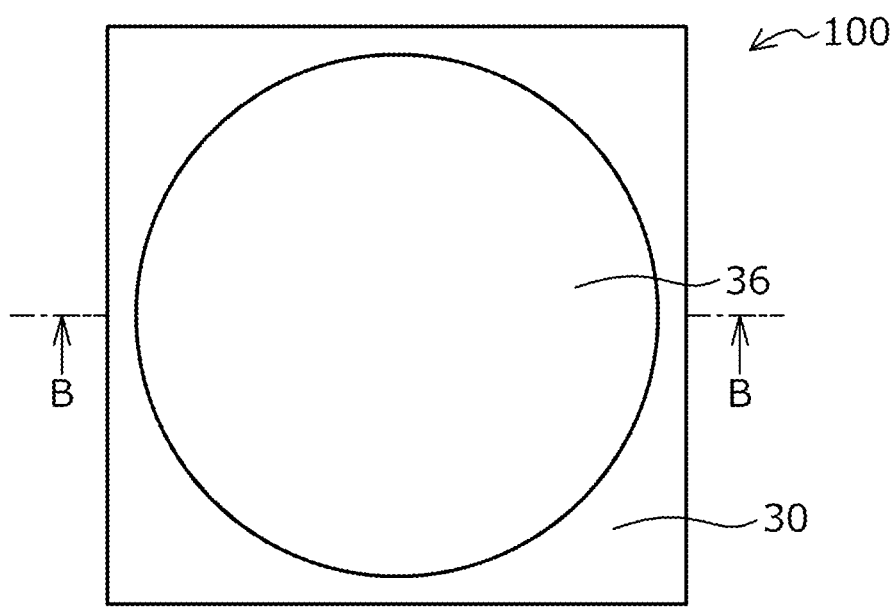
FIG. 2A is a schematic top view of a light-emitting device according to the first embodiment.
Figure 2B:
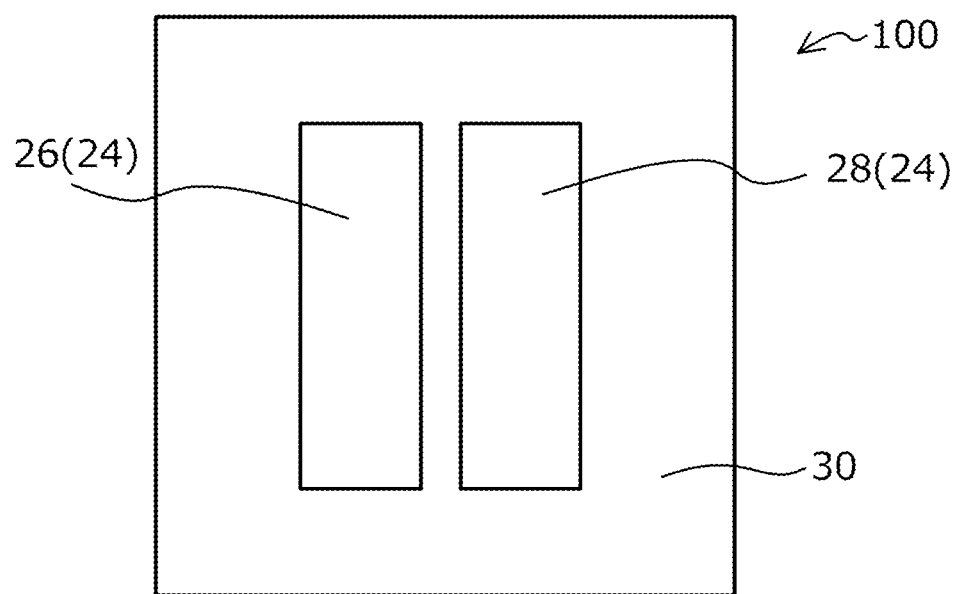
FIG. 2B is a schematic bottom view of a light-emitting device according to the first embodiment.
Figure 2C:
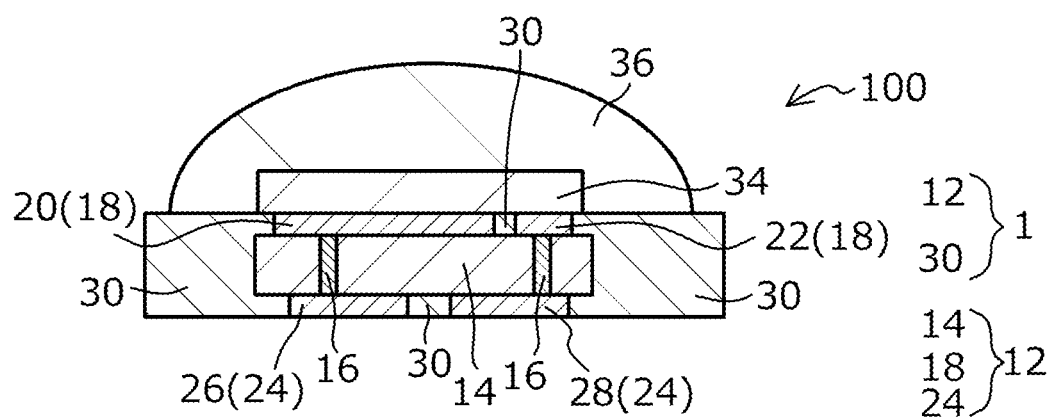
FIG. 2C is a sectional view taken along B-B in FIG. 2A.

According to the first embodiment, FIG. 2A is a schematic top view of a light-emitting device 100, FIG. 2B is a schematic bottom view of the light-emitting device 100, and FIG. 2C is a sectional view taken along B-B in FIG. 2A. As shown in FIGS. 2A to 2C, the light-emitting device 100 is a light-emitting device including the composite board 1 according to the first embodiment and at least one light-emitting element 34 mounted on the first wiring 18.

(Light-Emitting Element 34)

The light-emitting element 34 is mounted on the first wiring 18. As the light-emitting element 34, for example, a light-emitting element obtained by providing a semiconductor stack body (i.e., a body in which an n-side semiconductor layer, an active layer, and a p-side semiconductor layer are sequentially stacked) on a growth substrate (e.g., a sapphire substrate) as well as a light-emitting element from which a growth substrate is removed by laser lift-off, chemical lift-off, grinding, or the like can be used. While mounting of the light-emitting element 34 on the first wiring 18 can be performed by, for example, wire bonding or flip-chip mounting using a bump, mounting methods are appropriately specified.

(Encapsulant 36)

The light-emitting device 100 may include the encapsulant 36, which encapsulates the light-emitting element 34. A shape of the encapsulant 36 can be appropriately specified, for example, in a lens shape (e.g., a convex lens shape) which focuses light emitted from the light-emitting element 34.

(Protective Element)

The light-emitting device 100 may include a protective element. The protective element is mounted on, for example, the first wiring 18. When the protective element includes a positive electrode and a negative electrode, the positive electrode of the protective element is bonded and connected to the first region 20 of the first wiring 18 by, for example, a conductive bonding agent such as Ag paste and AuSn, and the negative electrode of the protective element is bonded and connected to, for example, the second region 22 of the first wiring 18 by wire bonding. The protective element is preferably partially covered by the covering member 30 and more preferably entirely covered by the covering member 30 so that light absorption by the protective element is reduced.

[Composite Board 2 According to Second Embodiment]

Figure 3:
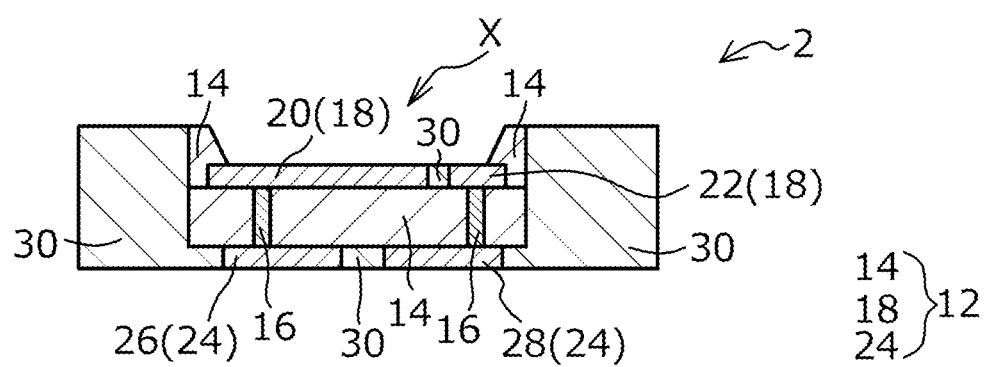
FIG. 3 is a schematic sectional view of a composite board according to a second embodiment.

FIG. 3 is a schematic sectional view of a composite board 2 according to a second embodiment. As shown in FIG. 3, the composite board 2 differs from the composite board, in which the base 14 has a flat plate shape, in that the base 14 of the composite board 2 includes a recess X. In this manner, members with various shapes can be used as the base 14 as well as a member with a flat plate shape. An inner lateral surface (i.e., an inner lateral wall) of the recess X may be perpendicular to or inclined with respect to a bottom surface of the recess X. In the case of an inclined inner lateral surface, the inner lateral surface is preferably inclined such that the closer to an upper surface, the wider an inner diameter of the recess X. Accordingly, when the light-emitting element 34 is placed on the bottom surface of the recess X, light from the light-emitting element 34 can be more readily reflected upward by the inner lateral surface of the recess X. As a result, light distribution of the light-emitting device can be adjusted by changing an angle of inclination of the inner lateral surface. In order to improve adhesion between the covering member 30 and the base 14, the covering member 30 is preferably provided to be particularly thick in a position where the recess X is formed.

[Light-Emitting Device 200 According to Second Embodiment]

Figure 4:
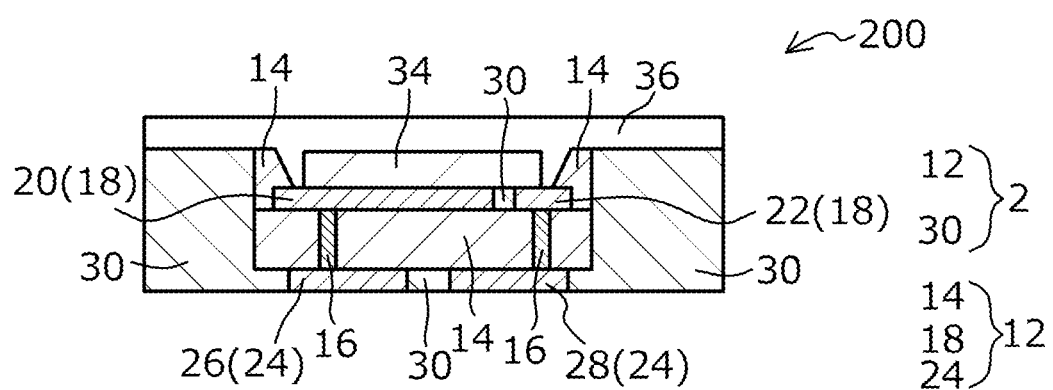
FIG. 4 is a schematic sectional view of a light-emitting device according to the second embodiment.

FIG. 4 is a schematic sectional view of a light-emitting device 200 according to the second embodiment. As shown in FIG. 4, the light-emitting device 200 differs from the light-emitting device 100 in that the light-emitting device 200 includes the composite board 2. In the light-emitting device 200, the light-emitting element 34 is placed on the bottom surface of the recess X included in the base 14.

[Composite Board 3 According to Third Embodiment]

Figure 5:
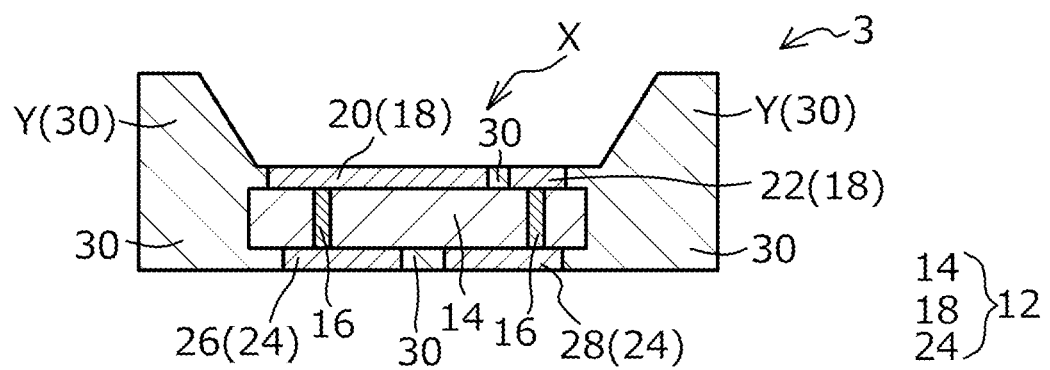
FIG. 5 is a schematic sectional view of a composite board according to a third embodiment.

FIG. 5 is a schematic sectional view of a composite board 3 according to a third embodiment. As shown in FIG. 5, the composite board 3 differs from the composite board 1 in that a frame Y, which is made of the same material as the covering member 30, is integrally formed with the covering member 30 and above an upper surface of the base 14. As described above, a recess X (i.e., a region enclosed by the frame Y) can be provided on the composite board 3 with the covering member 30 as well as using the base 14 in a shape of a flat plate. Examples of a method of forming the frame Y include pasting, drawing, compression molding, and transfer molding.

[Light-Emitting Device 300 According to Third Embodiment]

Figure 6:
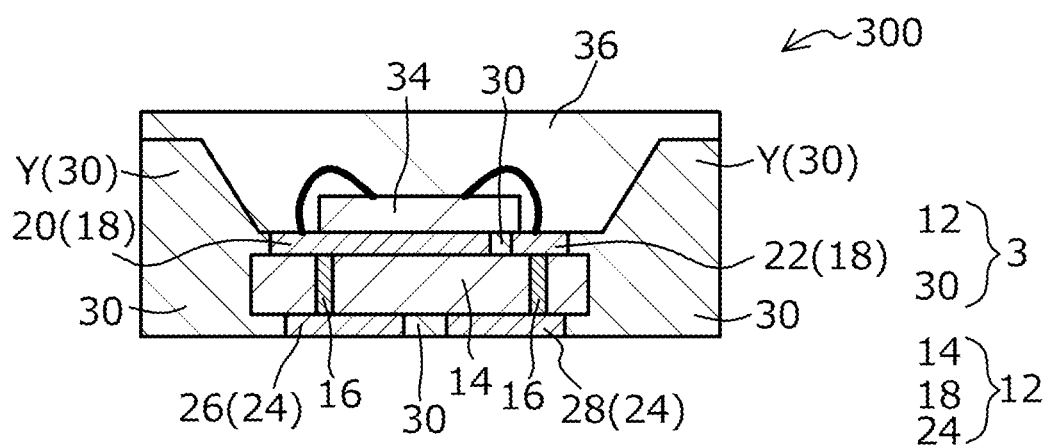
FIG. 6 is a schematic sectional view of a light-emitting device according to the third embodiment.

FIG. 6 is a schematic sectional view of a light-emitting device 300 according to the third embodiment. As shown in FIG. 6, the light-emitting device 300 differs from the light-emitting device 100 in that the light-emitting device 300 includes the composite board 3. In the light-emitting device 300, the light-emitting element 34 is placed on the bottom surface of the recess X (i.e., the region enclosed by the frame Y).

[Composite Board 4 According to Fourth Embodiment]

Figure 7:
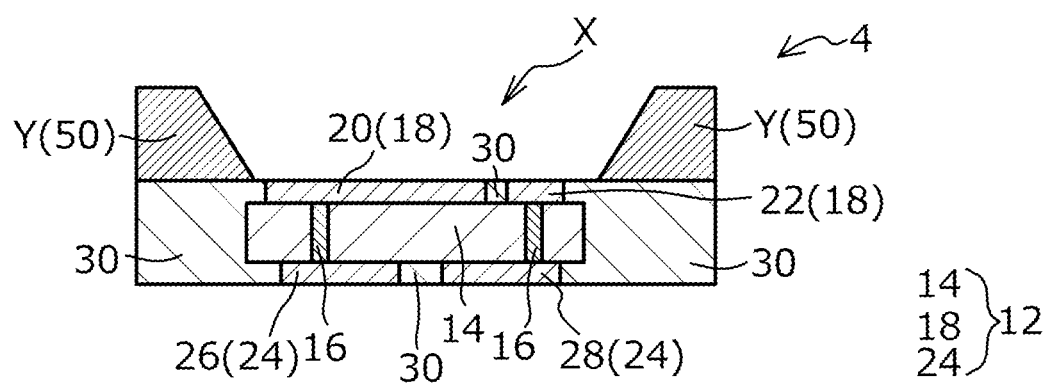
FIG. 7 is a schematic sectional view of a composite board according to a fourth embodiment.

FIG. 7 is a schematic sectional view of a composite board 4 according to a fourth embodiment. As shown in FIG. 7, the composite board 4 differs from the composite board 1 in that a frame Y, which is made of a material 50 that differs from the covering member 30, is separately provided from the covering member 30 and above an upper surface of the base 14. As described above, a recess X (i.e., a region enclosed by the frame Y) can be provided on the composite board 4 with a material 50 that differs from the covering member 30 as well as using the base 14 in a shape of flat plate. Examples of a method of forming the frame Y include pasting, drawing, compression molding, and transfer molding.

[Light-Emitting Device 400 According to Fourth Embodiment]

Figure 8:
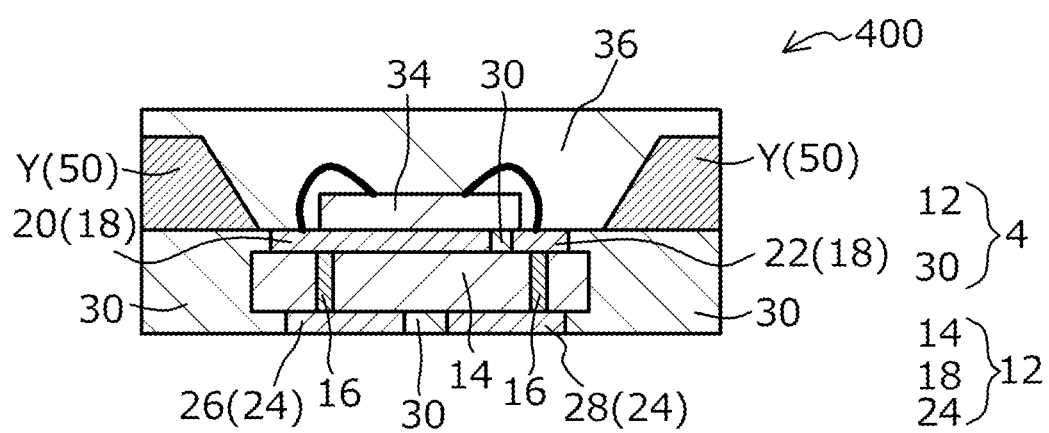
FIG. 8 is a schematic sectional view of a light-emitting device according to the fourth embodiment.

FIG. 8 is a schematic sectional view of a light-emitting device 400 according to the fourth embodiment. As shown in FIG. 8, the light-emitting device 400 differs from the light-emitting device 100 in that the light-emitting device 400 includes the composite board 4. In the light-emitting device 400, the light-emitting element 34 is placed on the bottom surface of the recess X (i.e., the region enclosed by the frame Y).

[Composite Board 5 According to Fifth Embodiment]

Figure 9:
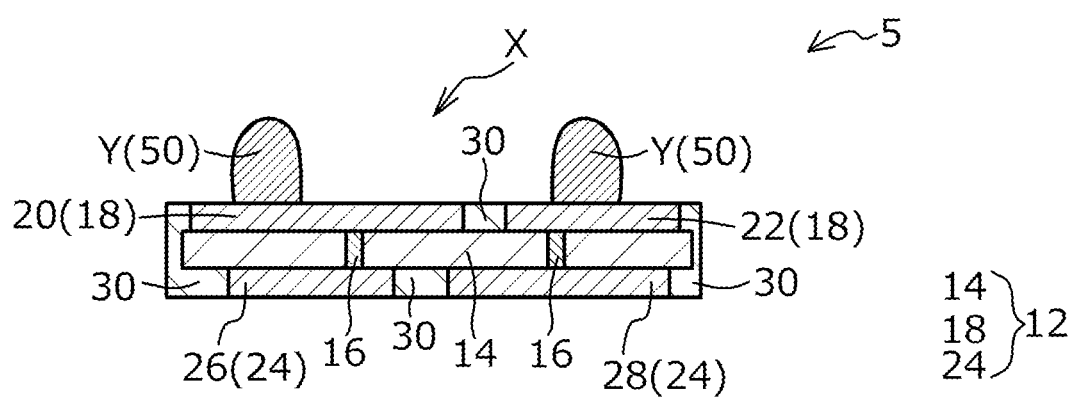
FIG. 9 is a schematic sectional view of a composite board according to a fifth embodiment.

FIG. 9 is a schematic sectional view of a composite board 5 according to a fifth embodiment. As shown in FIG. 9, the composite board 5 differs from the composite board 4 in which the frame Y is provided along an outer edge of the composite board 4 and a lateral surface of the frame Y serves as a lateral surface of the entire composite board 4. The point of difference in the composite board 5 is that a frame Y formed on the covering member 30 is provided on an inner side of an outer edge of the composite board 5. Even in this manner, a recess X (i.e., a region enclosed by the frame Y) can be provided on the composite board 5 with a material that differs from the covering member 30 as well as using the base 14 in a shape of flat plate.

[Light-Emitting Device 500 According to Fifth Embodiment]

Figure 10:
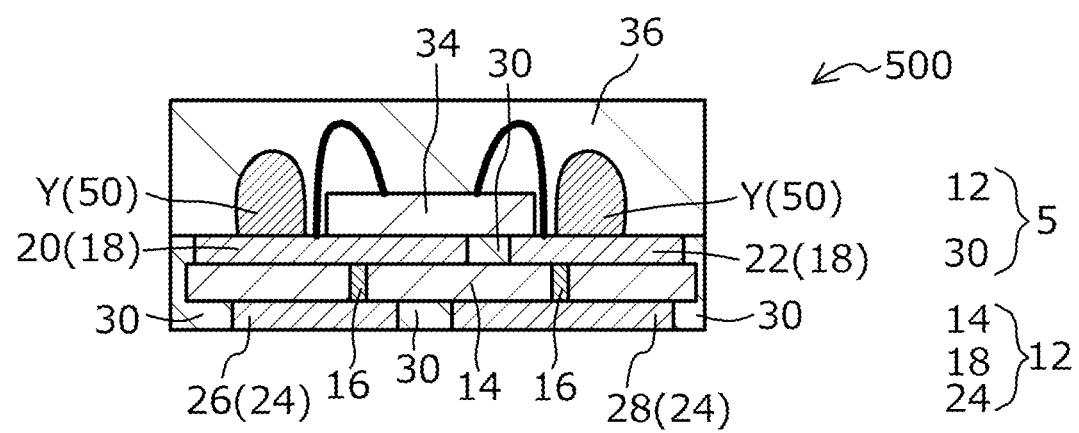
FIG. 10 is a schematic sectional view of a light-emitting device according to the fifth embodiment.

FIG. 10 is a schematic sectional view of a light-emitting device 500 according to the fifth embodiment. As shown in FIG. 10, the light-emitting device 500 differs from the light-emitting device 400 in that the light-emitting device 500 includes the composite board 5. In the light-emitting device 500, the light-emitting element 34 is placed on the bottom surface of the recess X (i.e., the region enclosed by the frame Y).

[Composite Board 6 According to Sixth Embodiment]

Figure 11:
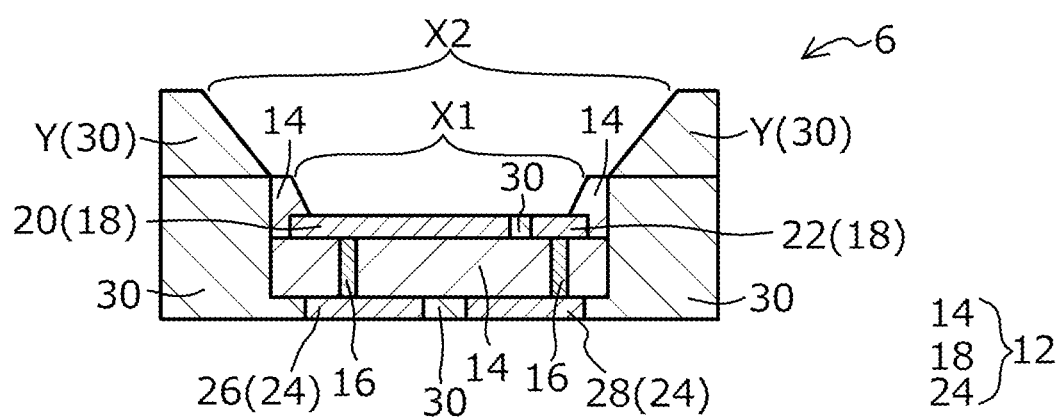
FIG. 11 is a schematic sectional view of a composite board according to a sixth embodiment.

FIG. 11 is a schematic sectional view of a composite board 6 according to a sixth embodiment. As shown in FIG. 11, the composite board 6 differs from the composite board 1 in that the composite board 6 includes the base 14 having a recess X1 and the covering member 30 having a frame Y. With the composite board 6, by combining the recess X1 with the frame Y, a recess X2 which includes the recess X1 and is larger than the recess X1, is formed (hereinafter, the recess X1 will be referred to as a first recess X1 and the recess X2 formed by combining the recess X1 and the frame Y with each other will be referred to as a second recess X2). A lateral wall of the second recess X2, a lower side is constituted by the base 14 made of ceramics and an upper side is constituted by the covering member 30 made of resin. Therefore, the upper side and the lower side of the lateral wall of the second recess X2 are respectively made of different materials. In a sectional view, an inner lateral wall of the second recess X2 may have a continuous linear shape or a curved surface without level differences from a bottom surface side to an upper surface side of the second recess X2. Alternately, the inner lateral wall of the second recess X2 may have a single or plurality of steps, or may have surfaces with angles that differ between a lower-side inner lateral wall (i.e., an inner lateral wall of a portion of the base 14) and an upper-side inner lateral wall (i.e., an inner lateral wall of a portion that is the covering member 30).

[Light-Emitting Device 600 According to Sixth Embodiment]

Figure 12:
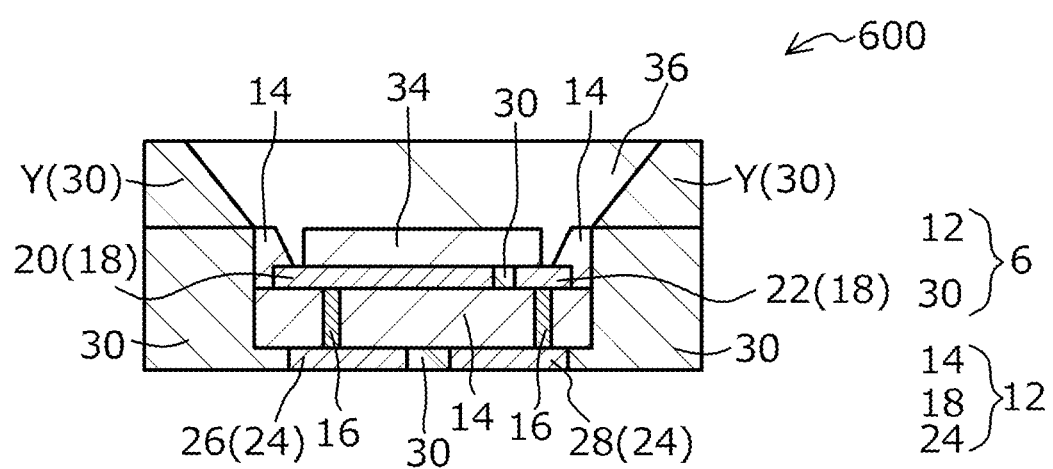
FIG. 12 is a schematic sectional view of a light-emitting device according to the sixth embodiment.

FIG. 12 is a schematic sectional view of a light-emitting device 600 according to the sixth embodiment. As shown in FIG. 12, the light-emitting device 600 according to the sixth embodiment differs from the light-emitting devices according to the other embodiments in that the light-emitting device 600 includes the composite board 6. In the light-emitting device 600 t, the light-emitting element 34 is placed on the bottom surface of the second recess X2 (which also constitutes the bottom surfaces of the first recess X1).

[Composite Board 7 According to Seventh Embodiment]

Figure 13:
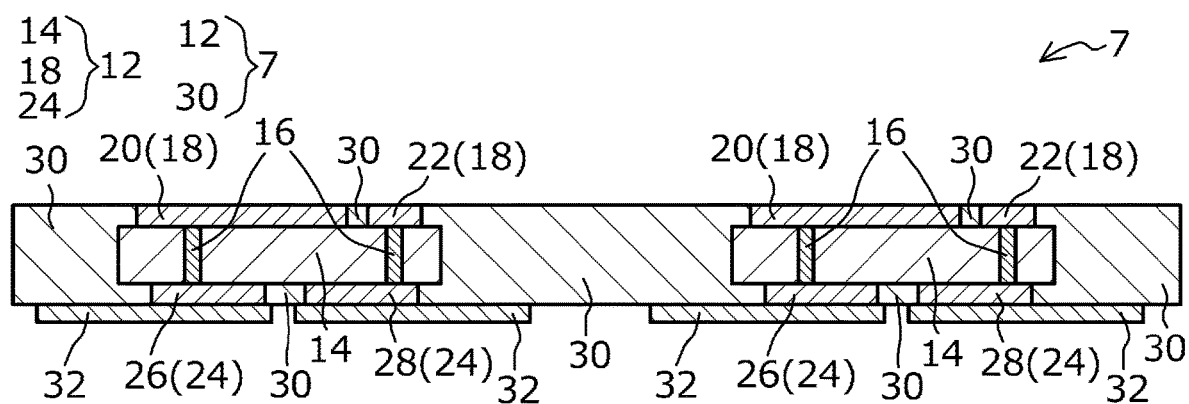
FIG. 13 is a schematic sectional view of a composite board according to a seventh embodiment.

FIG. 13 is a schematic sectional view of a composite board 7 according to a seventh embodiment. As shown in FIG. 13, the composite board 7 differs from the composite board 1, which includes one board 12 (base 14), in that the composite board 7 includes a plurality of boards 12 (bases 14). The plurality of boards 12 (bases 14) are integrated by the covering member 30.

[Light-Emitting Device 700 According to Seventh Embodiment]

Figure 14:
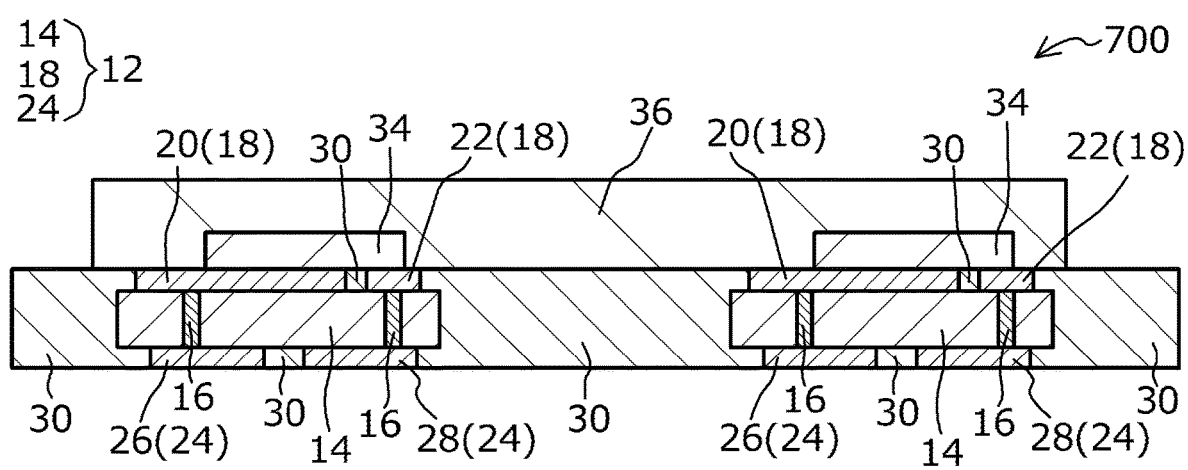
FIG. 14 is a schematic sectional view of a light-emitting device according to the seventh embodiment.

FIG. 14 is a schematic sectional view of a light-emitting device 700 according to the seventh embodiment. As shown in FIG. 14, the light-emitting device 700 differs from the light-emitting device 100, which includes one board 12 (base 14) and one light-emitting element 34, in that the light-emitting device 700 includes a plurality of boards 12 (bases 14) and a plurality of light-emitting elements 34. With the light-emitting device 700, since the plurality of boards 12 (bases 14) are separated inside one composite board 7, warpage or the like of the boards 12 (bases 14) can be mitigated by the covering member 30. Therefore, even if a width or a depth of the composite board 7 is increased, cracking or the like is less likely to occur in the boards 12 (bases 14) and workability in manufacturing steps is improved.

[Manufacturing Method of Light-Emitting Device 100 According to First Embodiment]

FIGS. 15A to 15H are schematic sectional views showing steps in a manufacturing method of a light-emitting device according to the first embodiment. Hereinafter, a description will be given with reference to FIGS. 15A to 15H.

(First Step)

Figure 15A:
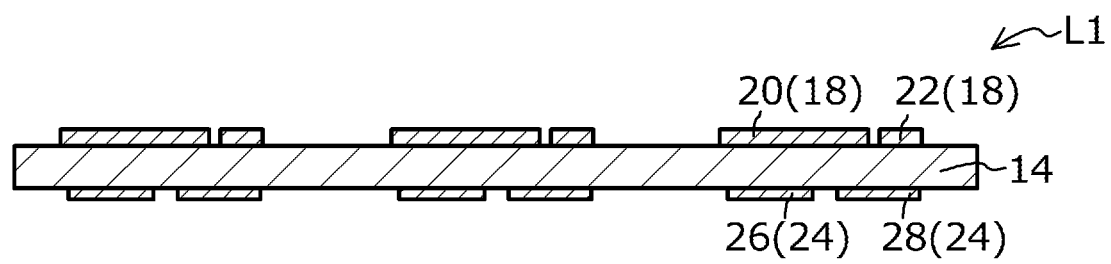
FIG. 15A is a schematic sectional view showing a step in a manufacturing method of a light-emitting device according to the first embodiment.

First, as shown in FIG. 15A, a board assembly L1 is prepared. The board assembly L1 is a plate-like member created by linking a plurality of boards 12 with each other and includes a base 14 made of ceramics, first wiring 18, and second wiring 24. The first wiring 18 and the second wiring 24 are respectively formed on an upper surface and a lower surface of the base 14. As the base 14, for example, a base fabricated by firing a stack of ceramic green sheets can be used. Although not shown in FIGS. 15A to 15H, a first region 20 of the first wiring 18 and a first region 26 of the second wiring 24 are electrically connected to each other via, for example, a through-hole (via) 16. In a similar manner, a second region 22 of the first wiring 18 and a second region 28 of the second wiring 24 are also electrically connected to each other via, for example, another through-hole (via) 16.

(Second Step)

Figure 15B:
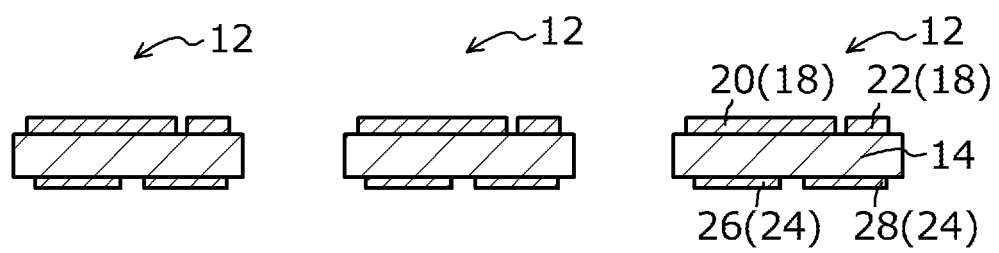
FIG. 15B is a schematic sectional view showing a step in the manufacturing method of a light-emitting device according to the first embodiment.

Next, as shown in FIG. 15B, by cutting the base 14 by laser dicing, blade dicing, or the like, the board assembly L1 is singulated to obtain a plurality of boards 12. Since a light-emitting element 34 and other components such as resin components (e.g., a wavelength converting layer and a lens) are not yet mounted on the base 14, the base 14 can be easily cut in a relatively short period of time using a method such as laser dicing and blade dicing. In other words, if the light-emitting element 34 and other components such as resin components were mounted on the base 14, when the base 14 is cut by laser dicing, the board 12 would become contaminated due to scorching or fumes of the resin components, or the like, and the individual boards 12 would need to be cleaned and the like after cutting. However, by cutting the base 14 before the light-emitting element 34 and other components such as resin components are mounted thereon, there is no need to perform such cleaning and the like. In addition, in the case where the base 14 is cut by blade dicing in a state where the light-emitting element 34 and other components such as resin components were mounted on the base 14, the blade may be clogged by a resin component, or a resin component covering the base 14 may separate from the base 14. As such, the blade would need to cut the resin component on the base 14 and, subsequently, cut the base 14 at a separate timing. However, by cutting the base 14 before the light-emitting elements 34 and other components such as resin components are mounted thereon, there is no need to perform such two-stage cutting. Therefore, the time and cost required to singulate the board assembly L1 can be reduced in both cases of laser dicing and blade dicing. Laser dicing and blade dicing are merely examples, and the time and cost required to singulate the board assembly L1 can also be reduced in cases where the base 14 is cut by other methods as long as such cutting is performed before mounting the light-emitting elements 34 and other materials such as the resin components.

(Third Step)

Figure 15C:
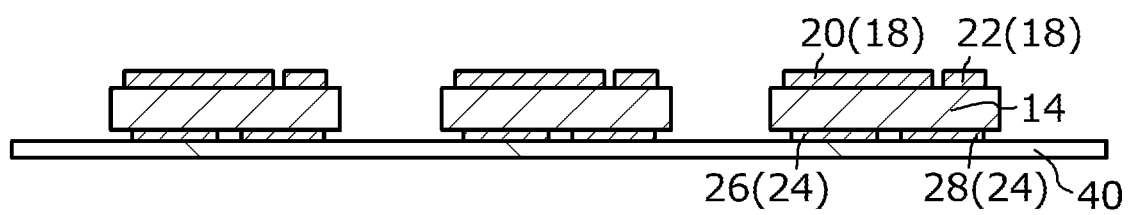
FIG. 15C is a schematic sectional view showing a step in the manufacturing method of a light-emitting device according to the first embodiment.

Next, as shown in FIG. 15C, the plurality of boards 12 obtained by singulating the board assembly L1 are placed at predetermined intervals on a sheet 40 and, at the same time, the plurality of boards 12 are adhered to the sheet 40 using an adhesive material. While examples of the sheet 40 include polyimide, a glass cloth, polyester, and polypropylene, the sheet 40 is preferably polyimide or a glass cloth with high heat resistance. Examples of the adhesive material include an acrylic-based adhesive material and a silicone-based adhesive material. Placement can be performed using a mounter, a sorter, or the like. The intervals between the boards 12 can be expanded using an expander after placing the boards 12 on the sheet 40 by transferring or other methods.

(Fourth Step)

Figure 15D:
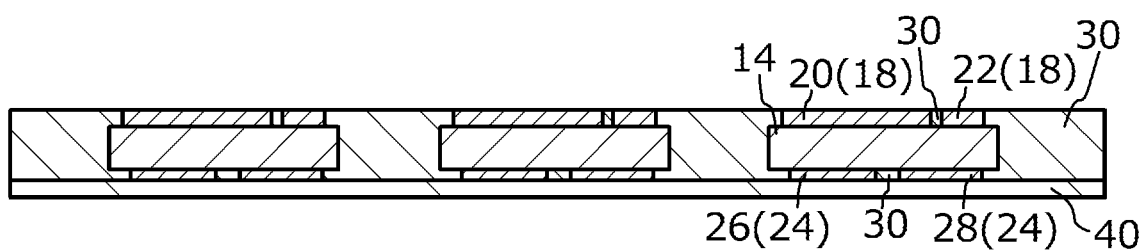
FIG. 15D is a schematic sectional view showing a step in the manufacturing method of a light-emitting device according to the first embodiment.

Next, as shown in FIG. 15D, the covering member 30 is provided on the sheet 40 such that each first wiring 18 is exposed on an upper surface side of the plurality of boards 12 to integrate the plurality of boards 12. The covering member 30 can be provided by transfer molding, compression molding, or other methods. The covering member 30 is preferably provided so as to cover entire lateral surfaces of the base 14. Accordingly, as will be described later, since the composite board 1 can be singulated by cutting the covering member 30 provided between the bases 14 or, in other words, without cutting the base 14, the time and cost required to singulate the composite board 1 can be reduced.

(Fifth Step)

Figure 15E:
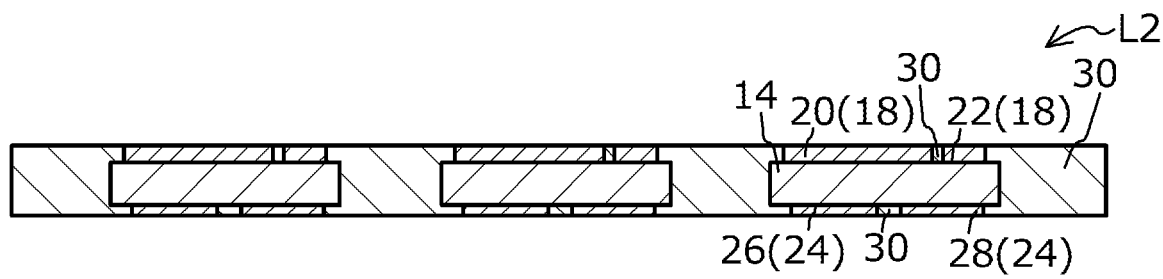
FIG. 15E is a schematic sectional view showing a step in the manufacturing method of a light-emitting device according to the first embodiment.

Next, as shown in FIG. 15E, the sheet 40 is removed from the plurality of integrated boards 12, and each second wiring 24 is exposed on a lower surface side of the plurality of boards 12 to obtain a composite board assembly L2.

(Sixth Step)

Figure 15F:
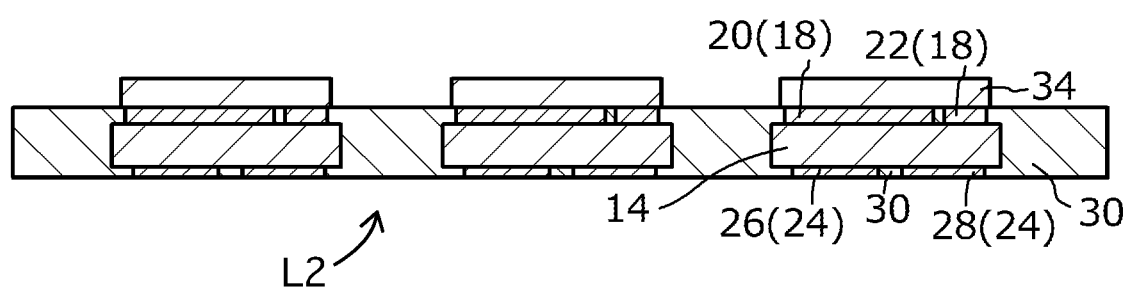
FIG. 15F is a schematic sectional view showing a step in the manufacturing method of a light-emitting device according to the first embodiment.
Figure 15G:
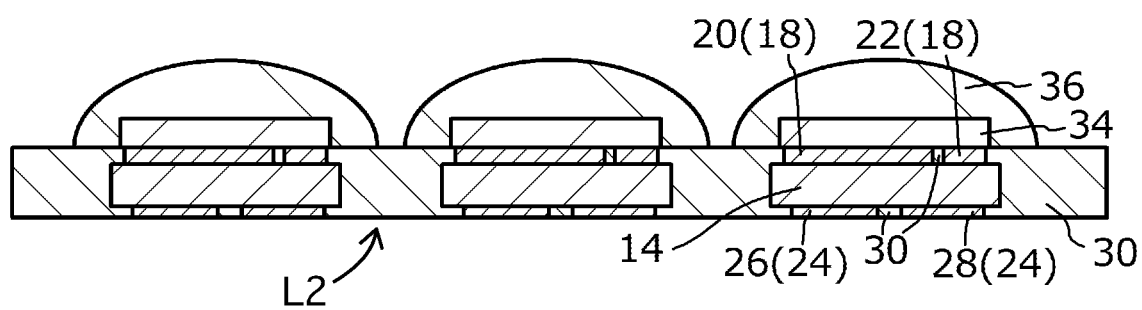
FIG. 15G is a schematic sectional view showing a step in the manufacturing method of a light-emitting device according to the first embodiment.

Next, as shown in FIG. 15F, the light-emitting elements 34 are mounted on each of the first wirings 18 on upper surface side of the composite board assembly L2. As shown in FIG. 15G, each light-emitting element 34 on the composite board assembly L2 may be encapsulated by the encapsulant 36 as necessary.

(Seventh Step)

Figure 15H:
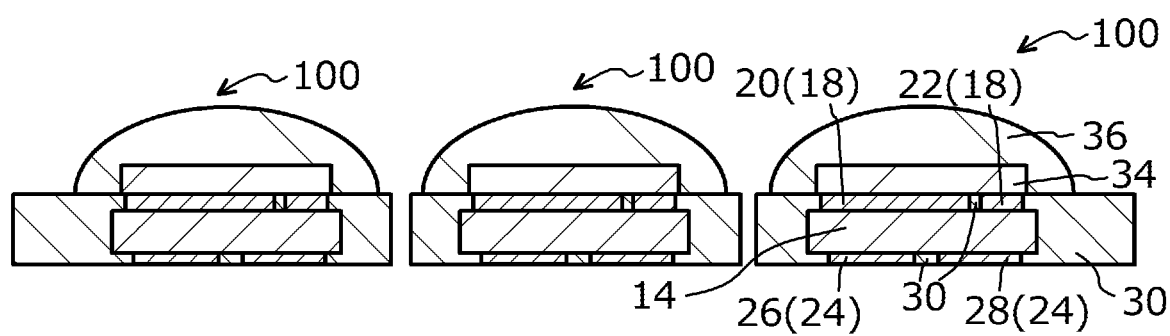
FIG. 15H is a schematic sectional view showing a step in the manufacturing method of a light-emitting device according to the first embodiment.

Next, as shown in FIG. 15H, by cutting the covering member 30 by laser dicing, blade dicing, or other methods, the composite board assembly L2 is singulated to obtain a plurality of light-emitting devices 100. Specifically, for example, the covering member 30 provided between the bases 14 is cut without cutting the base 14 at all or without hardly cutting the base 14. Since the covering member 30 with lower strength than the base 14 is cut instead of the base 14, the time and cost required for singulation of the composite board assembly L2 can be reduced as compared to a case where the base 14 is cut.

As described above, according to the present embodiment, the board assembly L1 is singulated by cutting the base 14 in a stage where the light-emitting elements 34 resin materials (e.g., a wavelength conversion layer and a lens), and the like are not yet mounted.

In addition, the composite board assembly L2 is singulated by cutting the covering member 30 provided between the bases 14 instead of cutting the base 14. Hence, according to the present embodiment, the time and cost required to manufacture the light-emitting device 100 including the composite board 1 can be reduced.

[Manufacturing Method of Light-Emitting Device 200 According to Second Embodiment]

The manufacturing method of the light-emitting device 200 according to the second embodiment differs from the manufacturing method of the light-emitting device 100 according to the first embodiment in that the base 14 including the recess X is prepared in the first step described above. Other than this difference, the manufacturing method of the light-emitting device 200 is the same as the manufacturing method of the light-emitting device 100; therefore, a description thereof will be omitted.

[Manufacturing Method of Light-Emitting Device 300 According to Third Embodiment]

The manufacturing method of the light-emitting device 300 according to the third embodiment differs from the manufacturing method of the light-emitting device 100 according to the first embodiment in that a mold having a cavity capable of forming the frame Y is prepared, and the frame Y is integrally formed with the covering member 30 above an upper surface of the base 14 using a same material as the covering member 30 in the fourth step described above. Other than this difference, the manufacturing method of the light-emitting device 300 is the same as the manufacturing method of the light-emitting device 100; therefore, a description thereof will be omitted.

[Manufacturing Method of Light-Emitting Device 400 According to Fourth Embodiment]

The manufacturing method of the light-emitting device 400 according to the fourth embodiment differs from the manufacturing method of the light-emitting device 100 according to the first embodiment in that the frame Y that is additionally provided on the covering member 30 is formed above an upper surface of the base 14 using the material 50 that differs from the covering member 30 in the fourth step described above. Other than this difference, the manufacturing method of the light-emitting device 400 is the same as the manufacturing method of the light-emitting device 100; therefore, a description thereof will be omitted.

[Manufacturing Method of Light-Emitting Device 500 According to Fifth Embodiment]

The manufacturing method of the light-emitting device 500 according to the fifth embodiment differs from the manufacturing method of the light-emitting device 100 according to the first embodiment in that the frame Y that is additionally provided on the covering member 30 is formed above an upper surface of the base 14 and on an inner side of an outer edge of the composite board 5 using a material that differs from the covering member 30 in the fourth step described above. Other than this difference, the manufacturing method of the light-emitting device 500 is the same as the manufacturing method of the light-emitting device 100; therefore, a description thereof will be omitted.

[Manufacturing Method of Light-Emitting Device 600 According to Sixth Embodiment]

The manufacturing method of the light-emitting device 600 according to the sixth embodiment differs from the manufacturing method of the light-emitting device 100 according to the first embodiment in that the base 14 including the recess X1 is prepared in the first step described above, and that the frame Y is integrally formed with the covering member 30 above an upper surface of the base 14 using a same material as the covering member 30 in the fourth step described above. In this case, the covering member 30 is provided such that the frame Y of the covering member 30 is combined with the recess X1 of the base 14 to form a recess X2 which is larger than the recess X1 of the base 14 and includes the recess X1 of the base 14. Other than these differences, the manufacturing method of the light-emitting device 600 is the same as the manufacturing method of the light-emitting device 100; therefore, a description thereof will be omitted.

[Manufacturing Method of Light-Emitting Device 700 According to Seventh Embodiment]

The manufacturing method of the light-emitting device 700 according to the seventh embodiment differs from the manufacturing method of the light-emitting device 100 according to the first embodiment in that:

(1) a member formed by linking a plurality of boards 12 with each other (hereinafter, referred to as a "board linked body") is obtained by singulating a board assembly L1 with the plurality of boards 12 as one unit in the second step described above, (2) all lateral surfaces of individual board linked bodies obtained by the singulation of the board assembly L1 are covered by the covering member 30 in the fourth step described above, and (3) a plurality of light-emitting devices 700 are obtained by singulating a composite board assembly L2 by cutting the covering member 30 provided between the board linked bodies in the seventh step described above. Other than the above differences, the manufacturing method of the light-emitting device 700 is the same as the manufacturing method of the light-emitting device 100; therefore, a description thereof will be omitted. As described with respect to the light-emitting device 700, each light-emitting device 700 includes a plurality of boards 12 (14) and a plurality of light-emitting elements 34.

While embodiments have been described above, the description merely represents examples of the present invention and is not intended to limit the configuration as defined in the scope of the claims in any way whatsoever.

What is claimed is:

1. A light-emitting device comprising:
   a plurality of boards, each of the plurality of boards includes: a base; first wiring provided on an upper surface of the base; second wiring provided on a lower surface of the base and electrically connected to the first wiring;
   a plurality of light-emitting elements, each of the plurality of light-emitting elements is respectively mounted on the plurality of boards;
   a covering member; and
   a plurality of encapsulants, each of the plurality of encapsulants respectively encapsulates the plurality of light-emitting elements,
   wherein, in each of the plurality of boards, all of the lateral surfaces of the base are covered by the covering member,
   wherein, in each of the plurality of boards, at least a part of the lower surface of the base is exposed from the covering member, and
   wherein the covering member is provided such that surfaces of the first wiring and the upper surface of the covering member are flush with each other in each of the plurality of boards.

2. The light-emitting device according to claim 1, wherein the covering member is provided such that surfaces of the second wiring are lower than the upper surface of the covering member in each of the plurality of boards.

3. The light-emitting device according to claim 1, wherein a thickness of the covering member on the lateral surface of the base is 100 µm to 1000 µm.

4. The light-emitting device according to claim 1, wherein the covering member on the lateral surface of the base is thicker than the base.

5. The light-emitting device according to claim 1, wherein a shape of the encapsulant is appropriately specified in a lens shape.

6. The light-emitting device according to claim 1, wherein each of the plurality of light-emitting elements is connected to the first wiring by a bump.

7. The light-emitting device according to claim 1, further comprises a protective element.

8. The light-emitting device according to claim 1, wherein the second wiring of each of the plurality of boards is exposed from a lower surface of the covering member.

9. The light-emitting device according to claim 1, wherein the covering member includes one or more resins selected from a group consisting of triazine derivative epoxy resin, epoxy resin, modified epoxy resin, silicone resin, modified silicone resin, acrylate resin, urethane resin, and unsaturated polyester.

10. The light-emitting device according to claim 9, wherein the covering member includes an acid anhydride, an antioxidant, a mold-releasing material, a light reflective member, an inorganic filler, a curing catalyst, a light stabilizer, and/or a lubricant as one or more additives in the resin.

* * * * *